United States Patent
D'souza (10) Patent No.: US 8,692,809 B2
(45) Date of Patent: Apr. 8, 2014

(54) AUTO-GAIN SWITCHING MODULE FOR ACOUSTIC TOUCH SYSTEMS

(75) Inventor: Henry M. D'souza, San Diego, CA (US)

(73) Assignee: Elo Touch Solutions, Inc., Milpitas, CA (US)

( * ) Notice: Subject to any disclaimer, the term of this patent is extended or adjusted under 35 U.S.C. 154(b) by 1035 days.

(21) Appl. No.: 11/481,630

(22) Filed: Jul. 6, 2006

(65) Prior Publication Data

US 2008/0007543 A1     Jan. 10, 2008

(51) Int. Cl.
    *G06F 3/043*    (2006.01)
(52) U.S. Cl.
    USPC .......................................................... 345/177
(58) Field of Classification Search
    None
    See application file for complete search history.

(56) References Cited

U.S. PATENT DOCUMENTS

| | | | |
|---|---|---|---|
| 3,997,914 | A | 12/1976 | White |
| 5,606,284 | A | 2/1997 | Tamesue et al. |
| 5,633,940 | A | 5/1997 | Wassink |
| 5,955,925 | A | 9/1999 | Segawa et al. |
| 6,420,934 | B1 | 7/2002 | Butler et al. |
| 6,510,188 | B1 | 1/2003 | Isaksen et al. |
| 6,577,188 | B2 * | 6/2003 | Ueno et al. ................. 330/85 |
| 6,597,898 | B1 | 7/2003 | Iwata et al. |
| 7,088,347 | B2 | 8/2006 | Iisaka et al. |
| 2002/0135570 | A1 | 9/2002 | Iisaka et al. |
| 2002/0150266 | A1 | 10/2002 | Hinkle et al. |
| 2003/0091126 | A1 | 5/2003 | Rabii |
| 2003/0179046 | A1 | 9/2003 | Lin et al. |
| 2005/0032496 | A1 | 2/2005 | Saeki |
| 2006/0044065 | A1 | 3/2006 | Ishida |
| 2006/0071912 | A1 | 4/2006 | Hill et al. |
| 2010/0090763 | A1 | 4/2010 | Benhamouda et al. |

FOREIGN PATENT DOCUMENTS

| | | |
|---|---|---|
| AU | 668243 | 4/1996 |
| EP | 0604295 | 6/1994 |
| EP | 0803977 | 10/1997 |
| EP | 0929150 | 7/1999 |
| EP | 1427102 | 6/2004 |
| JP | 61263303 | 11/1986 |
| JP | 61263304 | 11/1986 |
| JP | 07079124 A | 3/1995 |
| JP | 7263986 | 10/1995 |
| JP | 10-320105 A | 12/1998 |
| JP | 11-234055 A | 8/1999 |
| JP | 11251851 A | 9/1999 |
| JP | 2000-332557 A | 11/2000 |
| JP | 2001274645 A | 10/2001 |
| JP | 2002-534005 A | 10/2002 |

(Continued)

OTHER PUBLICATIONS

International Search Report for International Application No. PCT/US2007/015159.

(Continued)

*Primary Examiner* — Jason Olson (74) *Attorney, Agent, or Firm* — Alston & Bird LLP (57) ABSTRACT

An apparatus for processing signals received from an acoustic touch surface comprises an analog input receiving an analog input signal having a signal level. The analog input signal comprises data indicative of a touch location on a touch surface. A plurality of gain elements receive the analog input signal and output gain-adjusted analog signals. A gain selection module selects one of the gain-adjusted analog signals based on the signal level of the analog input signal.

20 Claims, 7 Drawing Sheets

(56) References Cited

FOREIGN PATENT DOCUMENTS

| | | |
|---|---|---|
| JP | 2002-351614 A | 12/2002 |
| JP | 2004153718 | 5/2004 |
| JP | 2006-135458 A | 5/2006 |
| JP | 2008-515089 A | 5/2008 |
| WO | WO-00/30025 A | 5/2000 |
| WO | WO 00/38409 A1 | 6/2000 |
| WO | WO-03/005292 A | 1/2003 |
| WO | WO-03/067511 A | 8/2003 |

OTHER PUBLICATIONS

Office Action mailed Mar. 13, 2012 in counterpart JP Application No. 2009-518297.

Summary of the JP Office Action mailed Mar. 13, 2012 in counterpart JP Application No. 2009-518297.

\* cited by examiner

AUTO-GAIN SWITCHING MODULE FOR ACOUSTIC TOUCH SYSTEMS

BACKGROUND OF THE INVENTION

This invention relates generally to acoustic touch systems, and more particularly, to processing signals received from acoustic touch pads and other touch surfaces.

Touch events are signified by an acoustic interaction between a surface of a touch pad or other touch surface and an object such as a fingertip or stylus. A plurality of transducers may be provided to acquire the acoustic signals at different locations within the touch pad. Signals representing two channels of the acoustic signals are output via a cable to an analog to digital (A/D) converter. These digital signals are processed to extract useable touch location information.

Before use, the touch pad may be calibrated and/or the calibration data stored which defines both x and y coordinates of a specific location on the touch pad surface. Signal information from live touch data then may be compared to and matched appropriately with calibration data to identify the location of the touch event in two dimensions across the surface.

Due to different types of touch events, a broad voltage range is experienced at the input to the A/D converter which has an operating range within which it converts data. If the operating range is set to accommodate the highest maximum voltage level, voltages at the low end of the scale may not register and/or suffer significantly from quantization error, and, as a result, corresponding touch events may not be recognized. Also, when the input to the A/D converter is higher than the maximum level of the operating range, the output of the A/D converter is "railed", frequency domain analysis produces a "splatter" across the spectrum, and the touch event may not be recognized or may even be incorrectly interpreted.

Therefore, a need exists for methods and apparatus to process acoustic signals from an acoustic touch pad or other touch surface to enable a more robust detection of touch events and reduce quantization error. Certain embodiments of the present invention are intended to meet these needs and other objectives that will become apparent from the description and drawings set forth below.

BRIEF DESCRIPTION OF THE INVENTION

In one embodiment, an apparatus for processing signals received from an acoustic touch surface comprises an analog input receiving an analog input signal having a signal level. The analog input signal comprises data indicative of a touch location on a touch surface. A plurality of gain elements receive the analog input signal and output gain-adjusted analog signals. A gain selection module selects one of the gain-adjusted analog signals based on the signal level of the analog input signal.

In another embodiment, a touch system comprises an acoustic touch pad, an auto-gain switching module and an analog to digital (A/D) converter. The auto-gain switching module receives first and second analog input signals from the touch pad. The first and second analog input signals have first and second signal levels and comprise data indicative of a touch location on the touch pad. The auto-gain switching module adjusts gain levels of the first and second analog inputs, and outputs a first and a second gain-adjusted signal to the A/D converter based on at least the first and second signal levels of the first and second analog input signals.

In another embodiment, a method for processing signals from an acoustic touch pad comprises receiving an analog input signal having a signal level. The analog input signal comprises data indicative of a touch location on a touch pad. A plurality of gain-adjusted analog signals is output by adjusting a gain of the analog input signal with a plurality of different gain responses. One of the gain-adjusted analog signals is selected based on the signal level of the analog input signal.

The foregoing summary, as well as the following detailed description of certain embodiments of the present invention, will be better understood when read in conjunction with the appended drawings. The figures illustrate diagrams of the functional blocks of various embodiments. The functional blocks are not necessarily indicative of the division between hardware circuitry. Thus, for example, one or more of the functional blocks (e.g., processors or memories) may be implemented in a single piece of hardware (e.g., a general purpose signal processor or a block or random access memory, hard disk, or the like). Similarly, the programs may be stand alone programs, may be incorporated as subroutines in an operating system, may be functions in an installed software package, and the like. It should be understood that the various embodiments are not limited to the arrangements and instrumentality shown in the drawings.

DETAILED DESCRIPTION OF THE INVENTION

Figure 1:
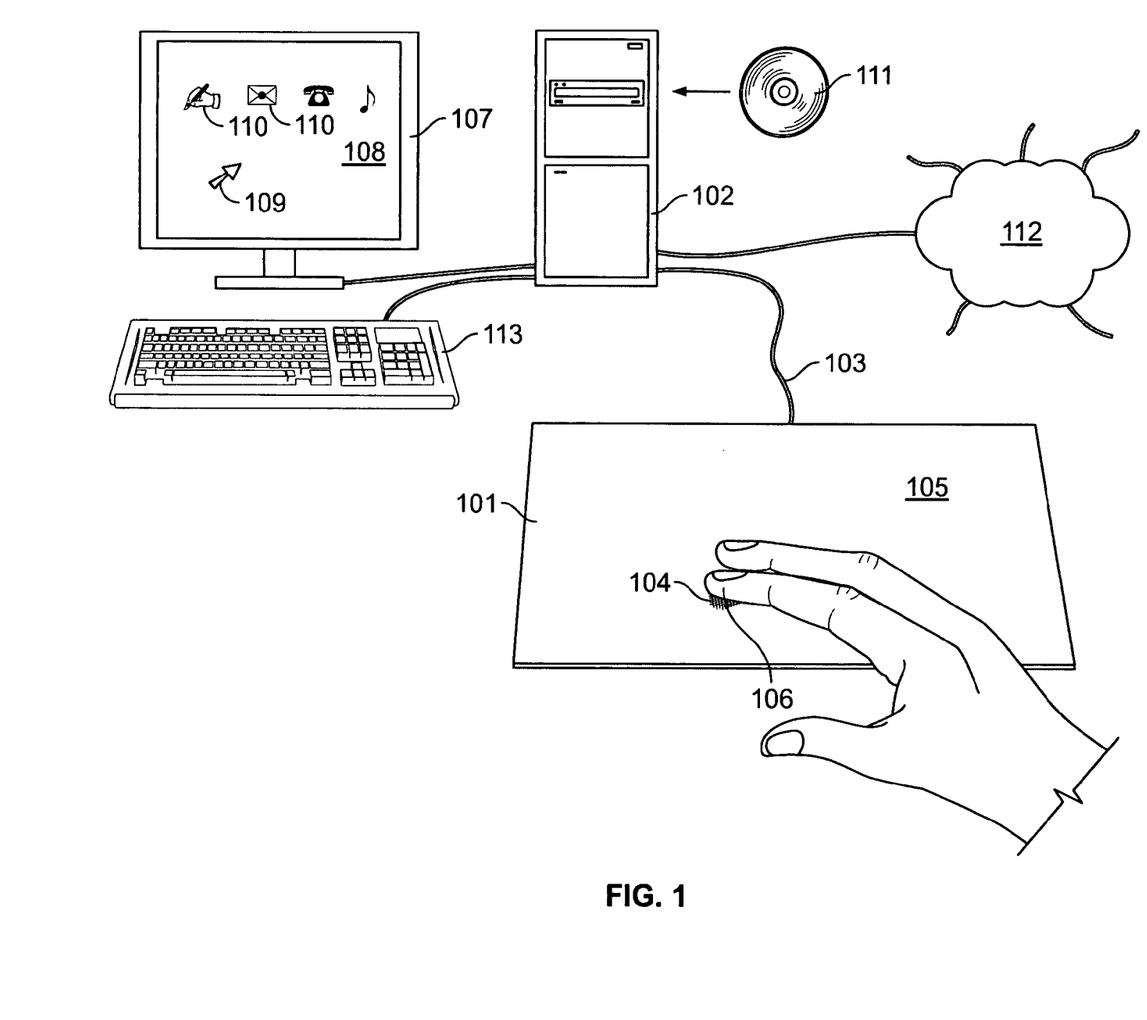
FIG. 1 illustrates a computer system using an acoustic touch pad which supplies signals to a computer via a connecting cable formed in accordance with an embodiment of the present invention.

FIG. 1 illustrates a computer system using a touch surface, indicated as touch pad 101, which supplies signals to a computer 102 via a connecting cable 103. Although the touch pad 101 is illustrated as a desk-top type configuration, it should be understood that the touch pad 101 may also be implemented as a touch panel, touchscreen, touchsensor or other touch surface. Analog signals from the touch pad 101 are generated in response to touch events 104 made on a surface 105 of the touch pad 101. The computer 102 supplies image signals to a monitor 107 which displays a graphical user interface 108 including a cursor 109 and icons 110. Instructions provided on a CDROM 111, via network 112, the Internet, or other memory device or source, enable the computer 102 to interpret analog signals from the touch pad 101, thereby enabling a user to navigate the graphical user interface 108 displayed on the monitor 107. A keyboard 113 supplies additional alphanumeric input and commands to the computer 102.

The touch pad 101 may receive at least two types of touch events. A first type of touch event is the sliding movement of a fingertip 106 across the surface 105 of the touch pad 101. In response to such movement, the computer 102 moves the cursor 109 in the graphical user interface 108 displayed on the monitor 107. A second type of touch event is a tap of the fingertip 106 against the surface 105. When the cursor 109 is located over an icon 110, a single tap may be interpreted by the computer 102 as a request to activate a process associated with that icon 110. Other types of tap interpretation are possible, such as double tap, as well as taps made in particular areas of the touch pad surface 105. In this way, a range of pointer-device activity required for navigating the graphical user interface 108 is provided.

Figure 2:
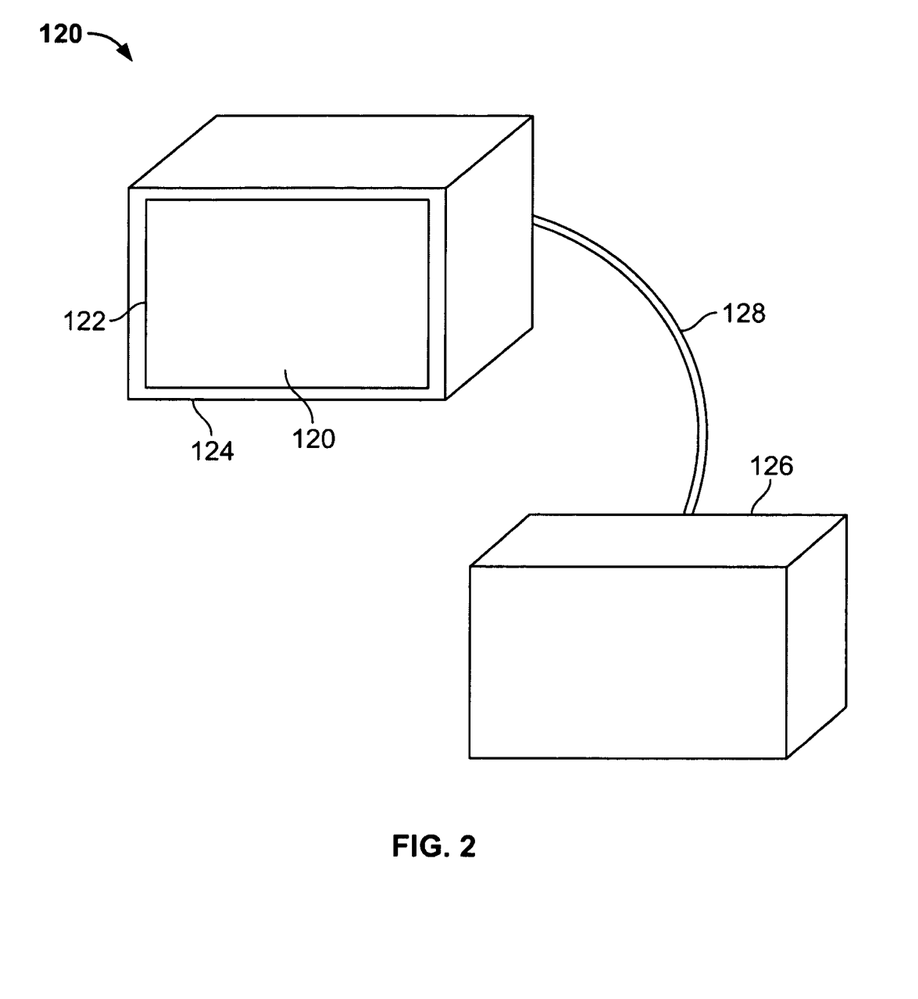
FIG. 2 illustrates a touch sensor system comprising a touchscreen formed of a transparent substrate to cover a screen of a display device in accordance with an embodiment of the present invention.

FIG. 2 illustrates a touch sensor system 120 comprising a touchscreen 122 formed of a transparent substrate to cover a screen of a display device 124. The touchscreen 122 may be mounted over the display device 124 horizontally, vertically, or at any angle, depending upon the application. The touchscreen 122 and a controller 126 may be coupled together with a lead 128. Graphics may be displayed to a user on the display device 124 and are visible through the touchscreen 122. The user may select an option by, for example, touching or tapping on the touchscreen 122 over a desired graphical location.

While one or more embodiments of this invention may have application to many types of acoustic touch pad systems, of particular interest are touch systems in which touches excite bending waves in the audible frequency range. "Bending" waves also may be referred to as flexural waves or as the lowest order anti-symmetric Lamb wave. Unlike acoustic touch systems in which the electronics excite as well as receive acoustic waves in the touch sensor (such as Rayleigh wave of "SAW" touchscreens), the electronics do not control received signal amplitudes. Furthermore, varying styles of user touches lead to a broad range of signal amplitudes. One or more embodiments of this invention are particularly suited to the needs of touch excited bending wave touch systems.

Figure 3:
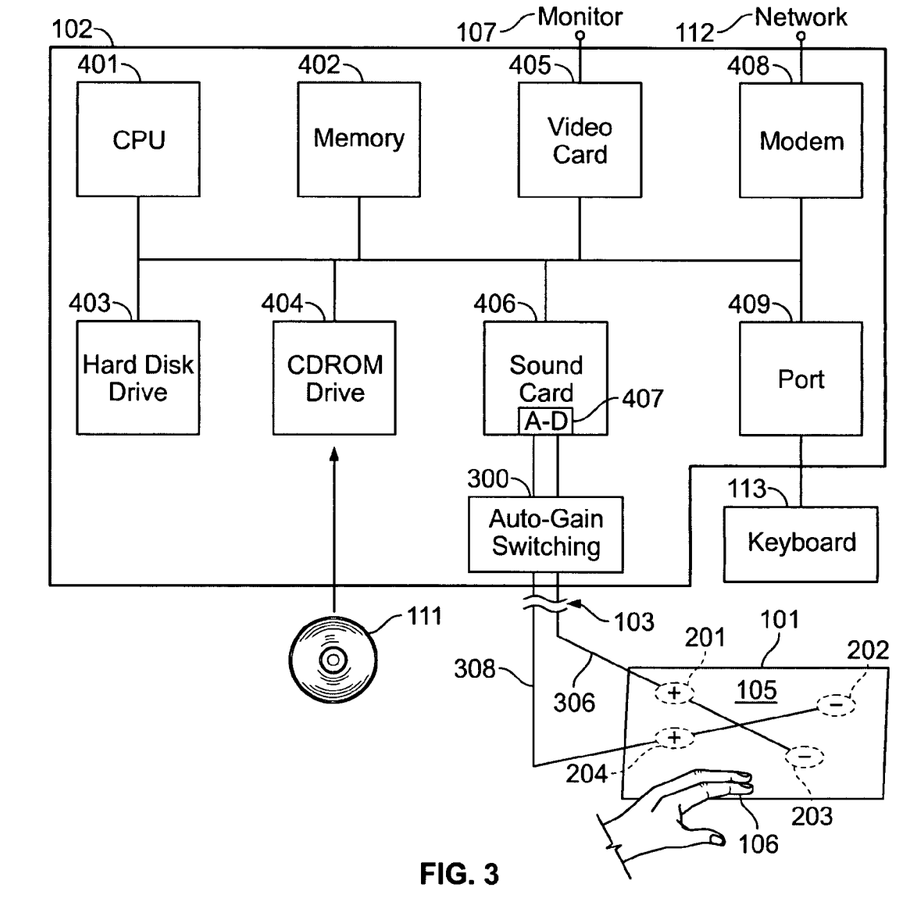
FIG. 3 illustrates the computer of FIG. 1 formed in accordance with an embodiment of the present invention.

FIG. 3 illustrates the computer 102 of FIG. 1. A central processing unit (CPU) 401 executes instructions held in main memory 402, which may be RAM or other type of volatile memory. The main memory 402 also stores data which the CPU 401 may manipulate according to its instructions. Both data and instructions may be stored on a hard disk drive 403. Instructions and/or data may be installed onto the hard disk drive 403 from a variety of sources, such as by using a CDROM drive 404 to read CDROM 111, or a port (not shown) to read an optical drive, flash memory and the like. A modem 408 may provide connectivity to the network 112. The keyboard 113 is connected via port 409, which may be hardwired or wireless.

A video card 405 receives instructions and data from the CPU 401 to render images on the monitor 107, thereby providing the user with the graphical user interface 108 (FIG. 1) that can be navigated by touch events formed on the touch pad 101. The cursor 109 may be the primary signifier of navigation in such an interface, and may be used to navigate environments having two and three dimensions. Instructions for interpreting touch pad signals require data representing calibrated touch pad characteristics, which may be stored in memory 402, on drive 403, CDROM 111 or transmitted over the network 112.

Turning to the touch pad 101, the surface 105 of the touch pad 101 is rigid and acoustically conductive, and may be made out of glass; high density polyethylene or other high density material, including polymers such as nylon; composite materials such as fiberglass; stone; metal, and the like. The top of the surface 105 may be unpolished, textured, or have a natural surface texture so that movement of a fingertip 106 across the surface 105 generates friction noise.

Transducers 201, 202, 203 and 204 may be piezo-electric transducers which have either positive or negative polarity depending upon the details of the electrical connections to the electronics. For example, the transducers 201 and 204 have positive polarity and transducers 202 and 203 have negative polarity.

The locations of the transducers 201-204 are asymmetric. The transducers 201 and 203 are connected as a pair in series with their polarities reversed. This achieves an anti-phase combination of their respective acoustic signals. The transducers 202 and 204 are connected similarly. As a result of the asymmetry of the locations of the transducers 201-204, and the combination of the signals from different asymmetric locations, each location on the surface 105 has one or more unique signal characteristics.

The transducers 201-204 may be bonded to the underside of the surface 105 by a thin layer of hard adhesive. Sound pressure waves moving through the surface 105 pass through the transducers 201-204, producing a varying electrical potential in proportion to the distortion of the piezo-ceramic material in the transducer. For some applications, an under-surface or base (not shown) of the touch pad 101 may be a light foam rubber or other material that supports the touch pad surface 105 away from any acoustic interference, as well as providing a protective covering to the transducers 201-204 and their electrical connections.

Touch events cause an acoustic interaction between the surface 105 of the touch pad 101 and an object, such as the user's fingertip 106. Acoustic signals are generated and result in sound being transmitted through the surface 105 from the location of the touch event. The four transducers 201-204 pick up acoustic signals in different parts of the surface 105 and convert the acoustic signals into electrical form. In other words, the transducers 201-204 translate the acoustic signals or sound waves into corresponding varying electrical potentials (sine waves of various frequencies represented in a Fourier transform) which are supplied to the computer 102 via the connecting cable 103. Acoustic signals from transducer locations 201 and 203 are combined electrically to form a left channel 306 (or left analog input signal) that is one of two stereo channels supplied to an auto-gain switching module 300 (discussed further below in FIG. 4). A right channel 308 (right analog input signal) is supplied in the same manner to the auto-gain switching module 300 by the electrical combination of signals from transducers 202 and 204. The auto-gain switching module 300 outputs left and right signals to the A/D converter 407 in the sound card 406 of the computer 102.

The sound card 406 (e.g. a signal digitizer) within the computer 102 receives analog signals from the auto-gain switching module 300. The sound card 406 has a stereo analog to digital (A/D) converter 407, and the outputs of the auto-gain switching module 300 are connected to the stereo microphone input of the sound card 406. The A/D converter 407 in the sound card 406 may be configured to operate at a sample rate of 44.1 kHz with sixteen bits of precision for each of the left and right stereo channels, although other conditions may be used. The sound card 406 digitizes incoming electrical signals from the multi-gain switching module 300, and makes these digitized acoustic signals available to the CPU 401. During operation, the stream of samples is temporarily stored in main memory 402, awaiting a burst of processor activity during which touch events are interpreted to update the user interface 108. This process of acquiring, storing, processing and updating is performed continuously without any delay apparent to the user, so that movement of the user's fingertip 106 across the surface 105 of the touch pad 101 results in a substantially continuous movement of the cursor 109 on the monitor 107. Other aspects of the user interface 108 may also be updated substantially continuously in response to user fingertip movements.

The A/D converter 407 generates two streams of samples representative of the left and right channels. When extracting characteristic information, each channel is processed in consecutive contiguous groups of samples as required by standard Digital Signal Processing systems. By way of example only, phase angle information may be generated for each of the left and right channels. Phase difference information based on the left and right phase angle information may then be calculated and used to identify the location of the touch event.

Figure 4:
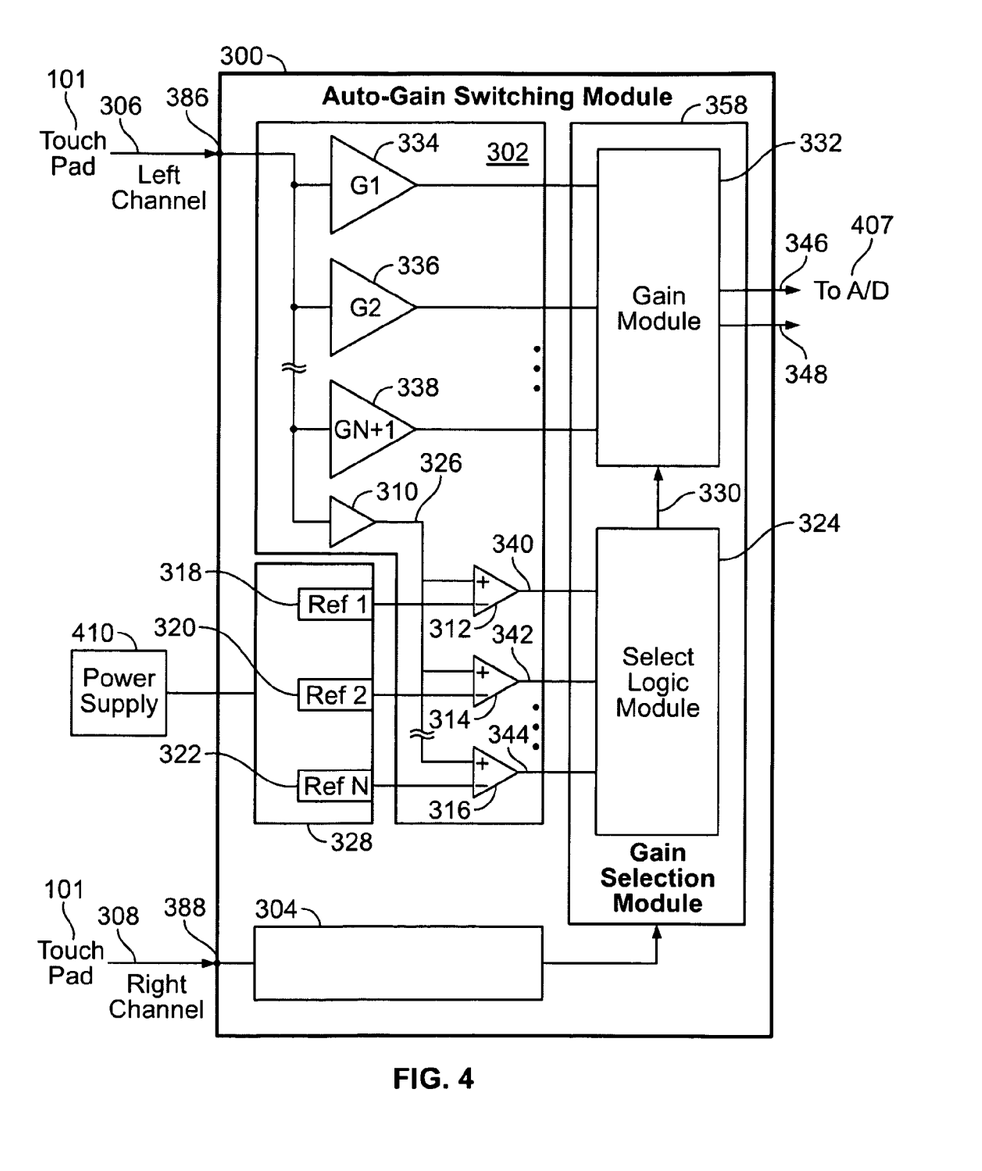
FIG. 4 illustrates the auto-gain switching module of FIG. 3 which improves the digitization and reduces quantization error of signals representing touch events in accordance with an embodiment of the present invention.

FIG. 4 illustrates the auto-gain switching module 300 of FIG. 3 which improves the digitization and reduces quantization error of signals representing touch events. As discussed previously, the range of voltages generated by the various touch events can vary greatly. For example, when a user drags their finger tip 106 on the surface 105, a very low level input signal is generated. When a tap occurs, an input signal having a much higher signal level is generated which may saturate the A/D converter 407 if not attenuated.

Quantization refers to assigning a commensurate digital value to a variable level input signal. Low signal levels may result in quantization error as there may be insufficient digital values to represent the signals in the near zero range to a good percentage resolution. The auto-gain switching module 300 thus increases the gain of low input analog voltages, which may be as low as a fraction of a millivolt, so that a larger range of digital values may be used to represent the low voltage signals. High analog voltages that are beyond the maximum level of the operating range of the A/D converter 407 may be decreased to ensure digitization and digital signal processing. The amount of gain adjustment is selected based on the current analog input level from the touch pad 101. As the signal level changes over time, the amount of gain adjustment is selected accordingly. By way of example, the processing logic determining the location of the touch event may be sensitive to the relative frequency content of the input signal but not the absolute magnitude. Therefore, the magnitude or amplitude may be changed without negatively impacting the digital signal processing.

First and second gain and rectifying circuits 302 and 304 are within the auto-gain switching module 300 and each processes one channel of information from the touch pad 101 (FIG. 3). The left channel 306 from the touch pad 101 is input via analog input 386 to the first gain and rectifying circuit 302 and the right channel 308 from the touch pad 101 is input via analog input 388 to the second gain and rectifying circuit 304. Left and right channels 306 and 308 are analog input signals that each carry at least one sine wave component with associated voltage levels and phase information. A gain selection module 358 selects the gain adjustment to be used for both the left and right channels 306 and 308 based on inputs from the first and second gain and rectifying circuits 302 and 304. For example, the gain selection module 358 may be a multiplexer (MUX). The operation of the first and second gain and rectifying circuits 302 and 304 is the same; therefore, the first gain and rectifying circuit 302 will be discussed.

The left channel 306 is input to a plurality of gain circuits (first gain element G1 334, second gain element G2 336, through gain element GN+1 338) which modify the left channel 306 based on specific gain characteristics. The gain circuits ensure that for each level of input signal, a gain-adjusted signal level within the operation range of the A/D converter 407 is available. Optionally, the smallest gain may be a voltage divider or attenuation to decrease the input analog signal or may provide no amplification to the input analog signal.

The left channel 306 is also input to rectifier/amplifier 310 which outputs an amplified positive signal 326 based on the left channel 306. The positive signal 326 is input to each of a plurality of comparator elements, such as first comparator element 312, second comparator element 314, through N comparator element 316. The comparator elements 312, 314, and 316 each compare the positive signal 326 to a reference voltage level, such as Ref 1 318, Ref 2 320 and Ref N 322, respectively. Ref 1 318 may be a very small voltage level, Ref 2 320 may be a small voltage level that is greater than the Ref 1 318, while Ref N 322 may be a relatively large voltage level, which may based on a signal level that would cause the A/D converter 407 to "rail" if the signal is not suitably attenuated.

By way of example, reference voltage levels may be supplied by a voltage divider 328 which receives power from a power supply 410 within the computer 102. Other apparatus may be used to supply the desired reference voltages. The number of reference voltages may be determined by the voltage range expected from the touch pad and may or may not divide the range equally.

When the positive signal 326 is above the level of Ref 1 318, the first comparator element 312 may output a high, a "1", or a preset voltage level such as 5 volts on output line 340. As the positive signal 326 is below the Ref 2 320 and Ref N 322, the second comparator element 314 and N comparator element 316 (as well as any other intervening comparators) output a ground, 0 volts or a different preset voltage level on output lines 342 and 344, respectively. When the positive signal 326 is above the level of Ref 2 320, the first and second comparator elements 312 and 314 output a high or other indication on output lines 340 and 342, respectively.

The output lines 340, 342 and 344 are monitored by a select logic module 324 within the gain selection module 358. A signal gain adjustment as output by the first, second, through N gain elements 334, 336 and 338 is associated with each of the first, second, through N comparator elements 312, 314 and 316. For a very low level of input analog voltage from the touch pad 101, the largest gain or amplification of the signal may be selected. For a very high level of input analog voltage from the touch pad, the smallest gain adjustment, no gain adjustment, or an attenuation of the signal may be selected as previously discussed.

Therefore, the amount of gain adjustment, as well as whether the gain adjustment is positive or negative, is based on the voltage level of the left channel 306 as output by the touch pad 101. For example, if the first comparator element 312 outputs a level indicating that the input voltage is greater than the Ref 1 318, the select logic module 324 selects a gain response associated with the first comparator element 312. If more than one comparator element, such as both the first and second comparator elements 312 and 314, indicate that the left channel 306 is greater than Ref 1 318 and Ref 2 320, respectively, the select logic module 324 selects the gain response associated with the higher voltage level, which in this example is the second comparator element 314. The select logic module 324 sends a select gain response signal 330 to a gain module 332 within the gain selection module 358.

The gain module 332 receives the select gain response signal 330 which indicates the level of gain selected for the left channel 306. If the level of the left channel 306 is very small, the gain might be the largest available. If the level of the left channel 306 is within the mid-range of the A/D converter 407, no gain adjustment may be applied. If the level of the left channel 306 is greater than the maximum value of the A/D converter 407, then the left channel 306 may be attenuated or reduced to ensure a gain-adjusted signal that is within the operating range of the A/D converter 407. The gain module 332 outputs a gain-adjusted left channel 346 to the A/D converter 407 for processing as previously discussed.

Optionally, the select logic module 324 may select the same level of gain adjustment for both of the left and right channels 306 and 308. The select logic module 324 may choose the largest gain adjustment identified by output lines 340, 342, and 344, as well as corresponding comparator outputs from the second gain and rectifying circuit 304. The select logic module 324 may also verify that the largest gain adjustment will not result in a signal level greater than the upper range limit of the A/D converter 407.

Figure 5:
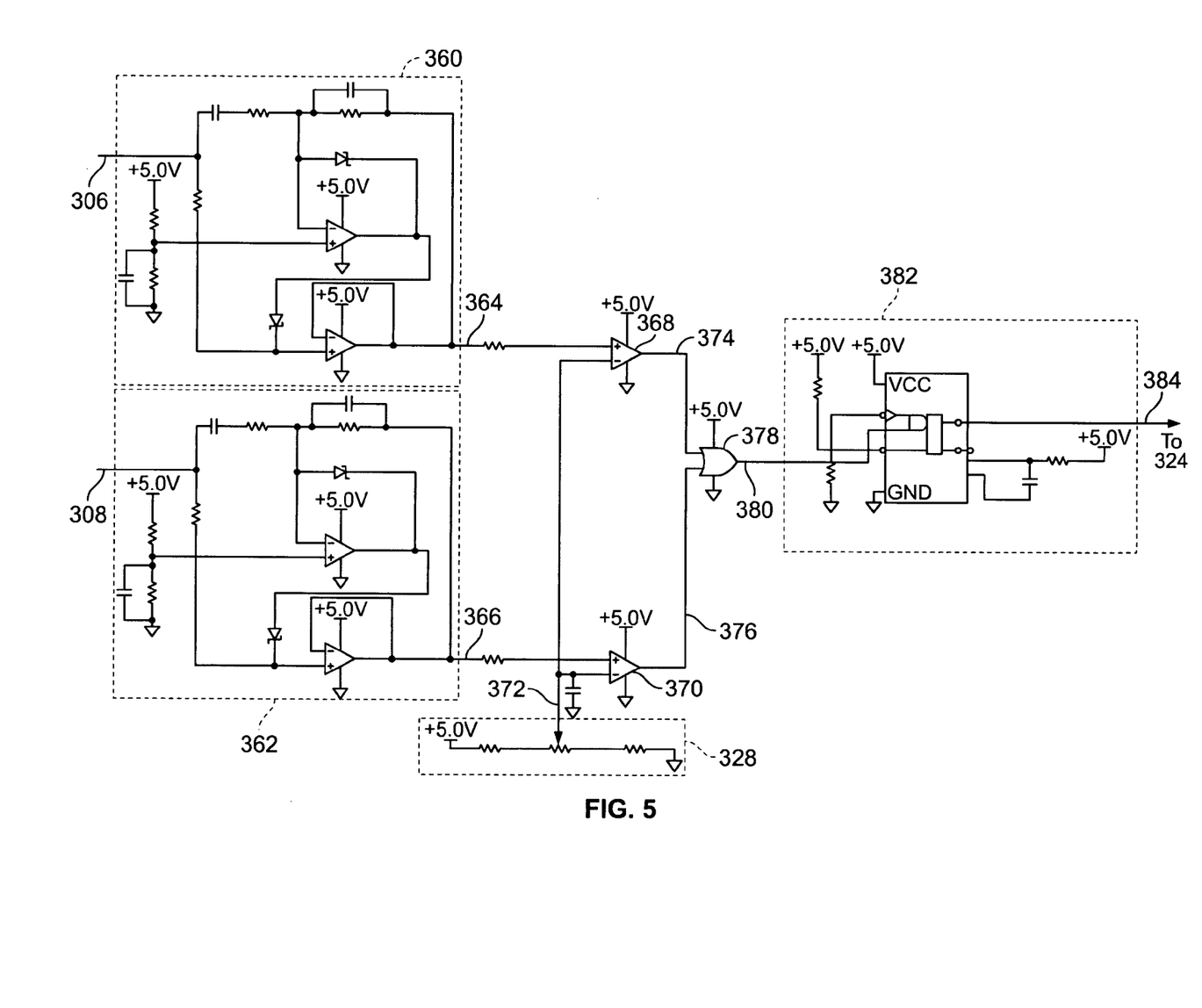
FIG. 5 illustrates an example of a rectifier/amplifier circuit for processing left and right channels from the touch pad in accordance with an embodiment of the present invention.

FIG. 5 illustrates an example of a rectifier/amplifier circuit for processing left and right channels 306 and 308 from the touch pad 101. For example, left rectifier/amplifier circuit 360 may correspond to the rectifier/amplifier 310 within the first gain and rectifying circuit 302 (FIG. 4) and right rectifier/amplifier circuit 362 may be within the second gain and rectifying circuit 304. The left rectifier/amplifier circuit 360 receives the left channel 306 from the touch pad 101 and the right rectifier/amplifier circuit 362 receives the right channel 308 from the touch pad 101. The left and right rectifier/amplifier circuits 360 and 362 apply a predetermined level of amplification to the left and right channels 306 and 308, respectively, and output left rectified signal 364 and right rectified signal 366, respectively, which are absolute values of the left and right channels 306 and 308 after amplification.

The left and right rectified signals 364 and 366 are input to left and right comparators 368 and 370 and compared to a reference voltage 372, such as from the voltage divider 328. The left and right signals are compared to the same reference voltage 372 or series of reference voltages. It should be understood that although one comparator is illustrated for each of the left and right channels, the left and right rectified signals 364 and 366 may each be input to a plurality of comparators as discussed in FIG. 4.

Left and right outputs 374 and 376 of the left and right comparators 368 and 370 are input to an OR gate 378. When either of the left or right rectified signals 364 or 366 exceeds the reference voltage 372, a 1 is output from the applicable left or right comparator 368 or 370. The OR gate 378 then has an output 380 of 1.

The output 380 of the OR gate 378 is input to a one shot 382 which creates a timing period of fixed duration in response to a change in signal on the output 380. When the input signal voltage exceeds a reference level, a different gain adjustment is selected by the gain module 332 (FIG. 4) and a single point discontinuity is introduced in the output signal, which is discussed below in FIGS. 7 and 8. It is desirable to remain at the same amplification stage (or gain adjustment stage) for a period of time greater than the time taken to collect a group/frame of data to be digitally processed. For example, the one shot 382 may be set to have a timing period of 100 ms and thus the selected gain adjustment is held for a minimum of 100 ms, or in certain cases for approximately 4 groups/frames of data processing.

The one shot 382 outputs a select gain response signal 384 to the select logic module 324 (FIG. 4). Optionally, the select logic module 324 may prevent the select gain response signal 330 from changing for the extent of the timing period even if one of the left and right channels 306 and 308 exceeds a reference voltage greater than the reference voltage 372.

Figure 6:
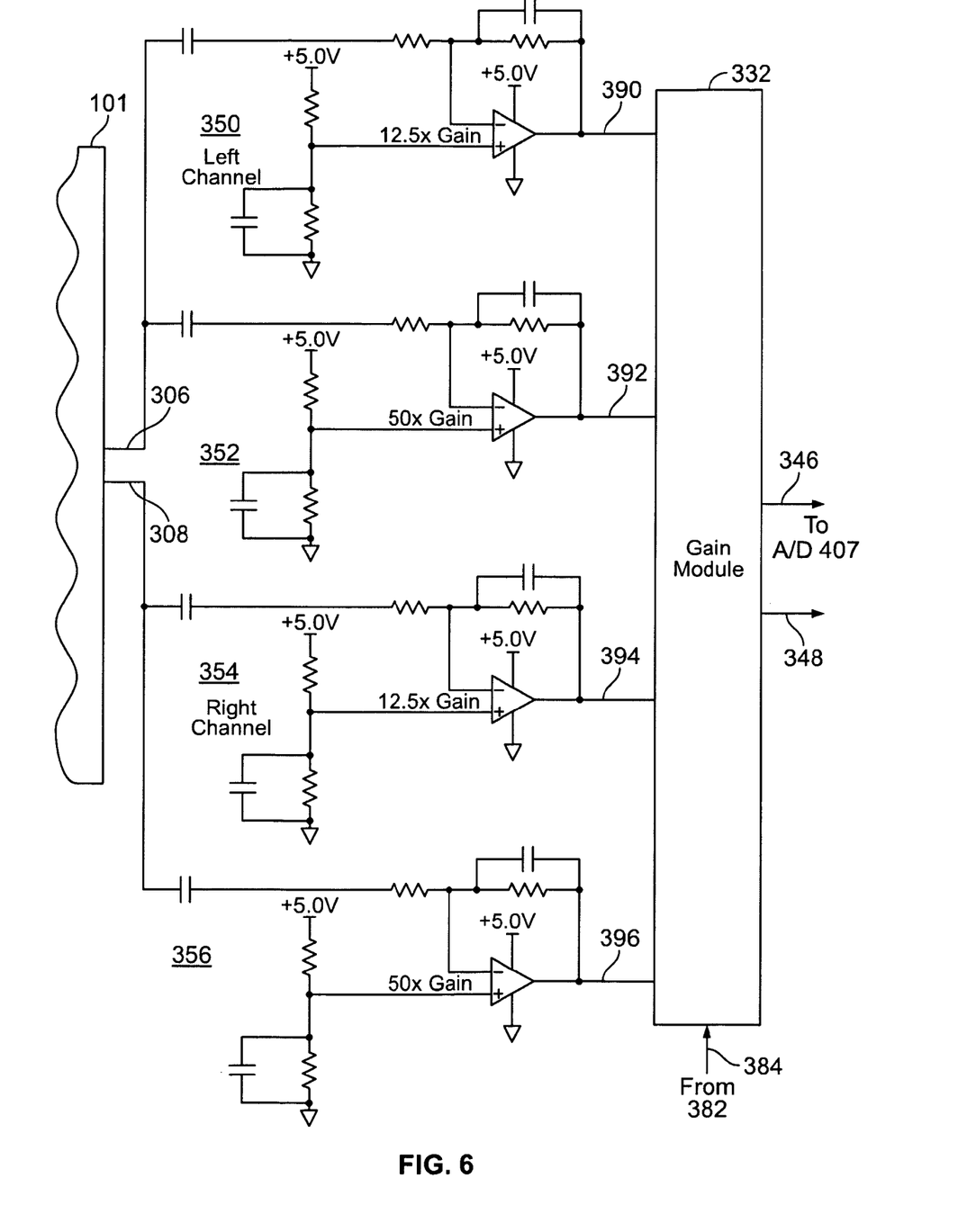
FIG. 6 illustrates an example of a gain circuit implementation formed in accordance with an embodiment of the present invention.

FIG. 6 illustrates an example of a gain circuit implementation. The left and right channels 306 and 308 are input. Two gain stages are illustrated for each of the left and right channels 306 and 308 and the same level of gain adjustment is provided for each channel. By way of example, first left gain stage 350 and first right gain stage 354 amplify the left and right channels 306 and 308, respectively, by 12.5×, or output a signal 12.5 times the voltage level of the input signal level. Second left gain stage 352 and second right gain stage 356 amplify the left and right channels 306 and 308, respectively, by 50× or 50 times the input signal level. Other multiplications and/or divisions may be used, such as to achieve an even larger effective signal dynamic range.

Gain-adjusted outputs 390, 392, 394, and 396 are provided to the gain module 332 which also receives the select gain response signal 384 (FIG. 5). Optionally, additional select logic may be used to determine which of the gain-adjusted signals to use. The same amplification level may be selected for both the left and right channels, which introduces the single point discontinuity on both channels. The gain module 332 outputs the gain-adjusted left channel 346 and gain-adjusted right channel 348 to the A/D converter 407.

Figure 7:
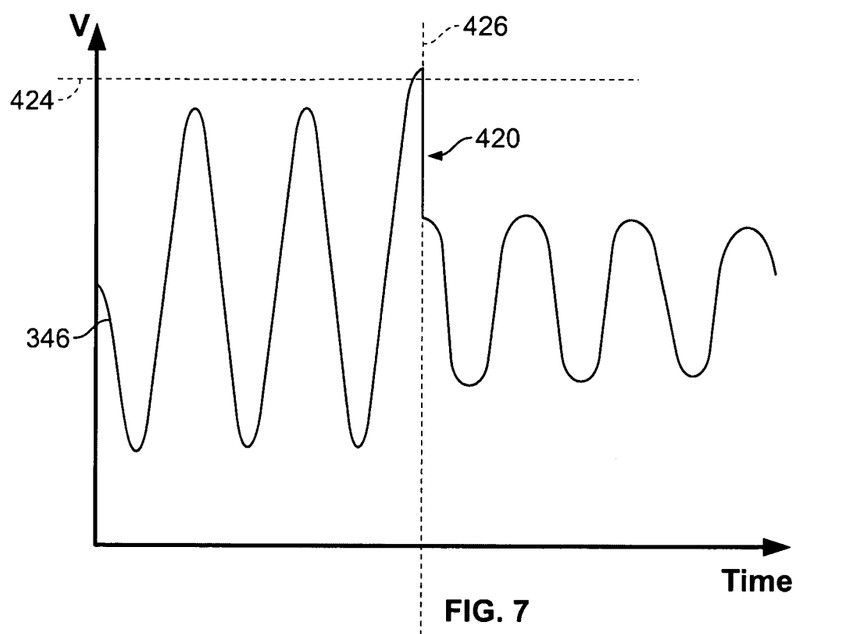
FIG. 7 illustrates a single point discontinuity in the gain-adjusted left channel in accordance with an embodiment of the present invention.
Figure 8:
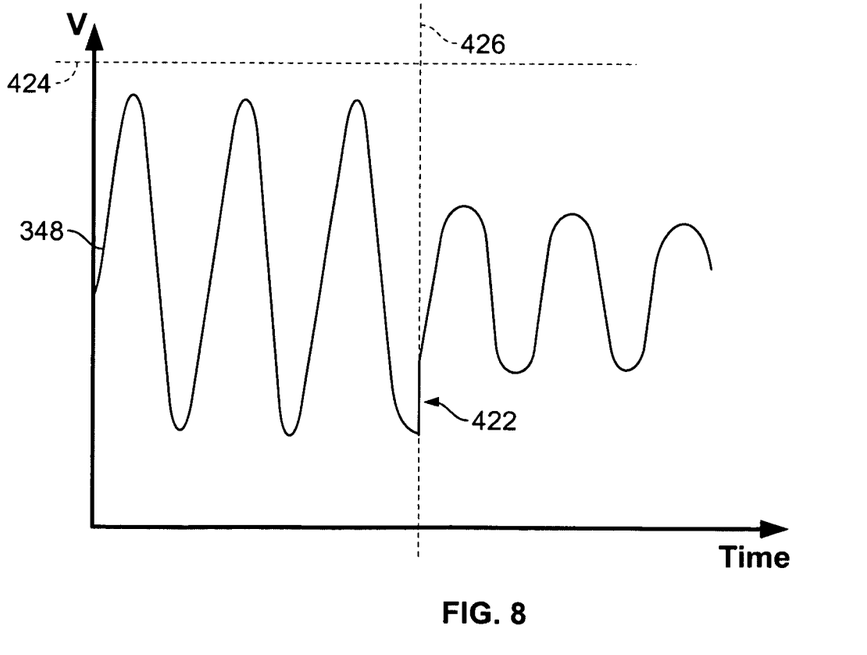
FIG. 8 illustrates a single point discontinuity in the gain-adjusted right channel in accordance with an embodiment of the present invention.

FIGS. 7 and 8 illustrate single point discontinuities 420 and 422 in the gain-adjusted left and right channels 346 and 348, respectively. With reference to FIG. 5 also, the reference voltage 372 (FIG. 5) is indicated as line 424 and is the same for both channels. When the left rectified signal 364 exceeds the reference voltage 372, the left comparator 368 outputs a 1 on left output 374 and the OR gate 378 outputs a 1 on output 380. The one shot 382 is triggered to hold the same output for a predetermined period of time and outputs a 1 on the select gain response signal 384 to the select logic module 324 regardless of any change on the output 380.

The select logic module 324 selects a different output from the gain module 332 that is at the next lowest gain. For example, if the output of the second gain element 336 had been selected, the output of the first gain element 334 will be selected. When the output switches from the second gain element 336 to the first gain element 334 at time 426, the single point discontinuities 420 and 422 result. The gain-adjusted left and right channels 346 and 348 then are output at the lower gain level for at least the time period of the one shot 382.

The A/D converter 407 operates as discussed above to output corresponding digital signals to the signal processing system. By way of example, any single point discontinuity may be eliminated from the final signal by subtracting the left and right channel signals from one another, such as in a system that identifies touch locations by finding the difference in phase. It should be understood that other signal processing algorithms may be used.

In another embodiment, the level of gain may be adjusted based on signals output from the A/D converter 407. Signal levels of left and right digital outputs of the A/D converter 407 may be sampled and then compared to reference voltages as previously discussed. A feedback control signal may be generated based on the comparison of the left and right digital outputs of the A/D converter 407, and sent to the gain module 332. The feedback control signal may be similar to the select gain response signal 330 (FIG. 4) and is used to select the level of adjustment used in the gain-adjusted left and right channels 346 and 348.

While the invention has been described in terms of various specific embodiments, those skilled in the art will recognize that the invention can be practiced with modification within the spirit and scope of the claims.

What is claimed is:

1. An apparatus for processing signals received from an acoustic touch surface, comprising:
   an analog input configured to receive an analog input signal having a signal level, the analog input signal comprising data indicative of a touch location on a touch surface;
   a plurality of gain elements configured to receive the analog input signal and output gain-adjusted analog signals; and
   a gain selection module configured to select one of the gain-adjusted analog signals based on the signal level of the analog input signal, wherein a gain-adjusted analog signal selected at a first time is output for at least a predetermined duration until a second time regardless of changes to the signal level of the analog input signal between the first time and the second time.

2. The apparatus of claim 1, further comprising a plurality of comparator elements configured to compare the analog input signal to a plurality of reference voltage levels, the gain selection module further configured to select the one of the gain-adjusted analog signals based on at least one output of the comparator elements.

3. The apparatus of claim 1, further comprising a comparator element configured to compare the analog input signal to a reference voltage level, the comparator element further configured to output a predetermined output when the analog input signal exceeds the reference voltage level, the gain selection module further configured to select the one of the gain-adjusted analog signals based on at least the output of the comparator element.

4. The apparatus of claim 1, further comprising a plurality of comparator elements configured to compare the analog input signal to a plurality of reference voltage levels, each of the plurality of comparator elements outputting a predetermined output when the analog input signal exceeds the respective reference voltage level, the gain selection module further configured to select the one of the gain-adjusted analog signals based on at least one output of the comparator elements.

5. The apparatus of claim 1, further comprising:
   a second analog input configured to receive a second analog input signal having a second signal level, the second analog input signal comprising second data indicative of the touch location on the touch surface; and
   a second plurality of gain elements configured to receive the second analog input signal and output second gain-adjusted analog signals, the gain selection module further configured to select the one of the second gain-adjusted analog signals based on at least one of the signal level of the analog input signal and the second signal level of the second analog input signal.

6. The apparatus of claim 1, further comprising:
   a second analog input configured to receive a second analog input signal having a second signal level, the second analog input signal comprising second data indicative of the touch location on the touch surface; and
   a second plurality of comparator elements configured to compare the second analog input signal to a plurality of reference voltage levels, the gain selection module further configured to select one of the gain-adjusted analog signals based on at least one output of the second plurality of comparator elements.

7. The apparatus of claim 1, wherein the gain selection module is further configured to detect a change in the signal level of the analog input signal and select a different gain-adjusted analog signal based on the change in the signal level.

8. A touch system, comprising:
   an acoustic touch pad;
   an auto-gain switching module configured to:
      receive first and second analog input signals from the touch pad, the first and second analog input signals having first and second signal levels and comprising relative spectral frequency content data indicative of a touch location on the touch pad; and
      adjust gain levels of the first and second analog input signals based on the first and second signal levels to generate first and second gain-adjusted signals, wherein the gain levels of the first and second analog inputs adjusted at a first time is held for at least a predetermined duration until a second time regardless of changes to the first and second signal levels between the first time and the second time; and
      output the first and second gain-adjusted signals to an analog to digital (A/D) converter.

9. The touch system of claim 8, wherein the auto-gain switching module further includes gain elements configured to adjust the first and second analog input signals by one of increasing the first and second signal levels, decreasing the first and second signal levels, and no adjustment.

10. The touch system of claim 8, wherein the auto-gain switching module is further configured to output the first and second gain-adjusted signals based on a signal level of at least one of the first and second gain-adjusted signals.

11. The touch system of claim 8, wherein the auto-gain switching module is further configured to select the gain levels of the first and second gain-adjusted signals based on an operating range of the A/D converter.

12. The touch system of claim 8, wherein the auto-gain switching module further includes first gain elements configured to receive the first analog input signal and output first gain-adjusted signals, the auto-gain switching module further including second gain elements configured to receive the second analog input signal and output second gain-adjusted signals, the auto-gain switching module further configured to output the first and second gain-adjusted signals from the first and second gain elements that have the same gain adjustment.

13. The touch system of claim 8, wherein the auto-gain switching module is further configured to output the first and second gain-adjusted signals with a different gain based on a detected change in at least one of the first and second signal levels at the first time, the auto-gain switching module further configured to maintain the first and second gain-adjusted signals at the different gain for a the predetermined duration until the second time regardless of changes to the second signal level of the second analog input signal between the first time and the second time.

14. The touch system of claim 8, further comprising a plurality of comparator elements configured to compare the first and second analog input signals to a plurality of reference voltage levels, the auto-gain switching module further configured to select the first and second adjusted signal levels based on outputs of the plurality of comparator elements.

15. The touch system of claim 8, wherein the first and second analog input signals further comprise sine waves, the auto-gain switching module further configured to output the first and second gain-adjusted signals with a first gain based on a first level of at least one of the first and second signal levels, the auto-gain switching module further configured to output the first and second gain-adjusted signals with a second gain based on a detected change in at least one of the first and second signal levels, the sine waves having a single point of discontinuity at a point corresponding to a change from the first gain to the second gain.

16. A method for processing signals from an acoustic touch pad, comprising:
   receiving an analog input signal having a signal level, the analog input signal comprising data indicative of a touch location on a touch pad;
   outputting a plurality of gain-adjusted analog signals by adjusting a gain of the analog input signal with a plurality of different gain responses; and
   selecting one of the gain-adjusted analog signals based on the signal level of the analog input signal, wherein a gain-adjusted analog signal selected at a first time is output for at least a predetermined duration until a second time regardless of changes to the signal level of the analog input signal between the first time and the second time.

17. The method of claim 16, further comprising:
   comparing the analog input signal to a plurality of reference voltage levels; and
   selecting the one of the gain-adjusted analog signals based on a result of the comparing step.

18. The method of claim 16, further comprising:
   comparing the analog input signal to a plurality of reference voltage levels; and
   selecting a second gain-adjusted analog signal based on a result of the comparing step.

19. The method of claim 16, further comprising:
   receiving a second analog input signal having a second signal level, the second analog input signal comprising second data indicative of the touch location; and
   selecting the one of the gain-adjusted analog signals based on at least the second signal level of the second analog input signal.

20. The method of claim 16, further comprising:
   receiving a second analog input signal having a second signal level, the second analog input signal comprising second data indicative of the touch location; and
   outputting a plurality of second gain-adjusted analog signals by adjusting a gain of the second analog input signal with the plurality of different gain responses, the selecting step further comprising selecting one of the second gain-adjusted analog signals based on at least one of the signal level and the second signal level, the one of the gain-adjusted analog signals and the second gain-adjusted analog signal being adjusted by a same gain response.

\* \* \* \* \*